United States Patent
Daishi

(10) Patent No.: US 9,429,798 B2
(45) Date of Patent: Aug. 30, 2016

(54) LIQUID CRYSTAL DISPLAY DEVICE

(71) Applicant: Japan Display Inc., Minato-ku (JP)

(72) Inventor: Kazuya Daishi, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/659,867

(22) Filed: Mar. 17, 2015

(65) Prior Publication Data

US 2015/0268521 A1    Sep. 24, 2015

(30) Foreign Application Priority Data

Mar. 24, 2014 (JP) ................. 2014-059843

(51) Int. Cl.
*G02F 1/1343* (2006.01)
*G02F 1/1362* (2006.01)

(52) U.S. Cl.
CPC .......... *G02F 1/134309* (2013.01); *G02F 2001/134318* (2013.01); *G02F 2001/136218* (2013.01)

(58) Field of Classification Search
CPC ............ G02F 1/134363; G02F 1/134309; G02F 1/136; G02F 1/1368; G02F 1/1337; G02F 1/133707; G02F 1/134336; G02F 1/13439; G02F 1/136286; G02F 1/133345; G02F 1/136213; G02F 1/1362; G02F 1/133; G02F 1/1333; G02F 1/1343; G02F 2001/134372; G02F 2001/134318; G02F 2001/134345; G02F 2001/13629; G02F 2201/123; G02F 2201/124; G02F 2201/128; G02F 2201/40; G06F 3/044; G06F 3/0412; G09G 2300/0426; G09G 2300/0439
USPC ......... 345/87, 103, 55; 257/72; 349/43, 139, 349/42, 138, 144, 141, 142, 38, 143, 123
See application file for complete search history.

(56) References Cited

U.S. PATENT DOCUMENTS

2013/0016297 A1* 1/2013 Nakamura ........ G02F 1/133707 349/46
2014/0036214 A1   2/2014 Hirosawa

FOREIGN PATENT DOCUMENTS

WO    WO 2012/137540 A1    10/2012

* cited by examiner

*Primary Examiner* — Thoi Duong
(74) *Attorney, Agent, or Firm* — Oblon, McClelland, Maier & Neustadt, L.L.P

(57) ABSTRACT

In a liquid crystal display device, a first interlayer insulating film is arranged on a gate line and first, second and third source lines. A first common electrode includes a first sub-common electrode on the first interlayer insulating film and facing the gate line. A second insulating film covers the first common electrode. A first main pixel electrode extends on the second interlayer insulating film between the first source line and the second source line. A second main pixel electrode extends on the second interlayer insulating film between the second source line and the third source line. A second common electrode includes a second sub-common electrode extending on the second interlayer insulating film between the first source line and the second source line so as to face the first sub-common electrode, and is cut out between the second source line and the third source line.

12 Claims, 9 Drawing Sheets

LIQUID CRYSTAL DISPLAY DEVICE

CROSS-REFERENCE TO RELATED APPLICATION

This application is based upon and claims the benefit of priority from prior Japanese Patent Application No. 2014-059843 filed Mar. 24, 2014, the entire contents of which are incorporated herein by reference.

FIELD

Embodiments described herein relate generally to a liquid crystal display device.

BACKGROUND

Recent years, in an active matrix type liquid crystal display device equipped with a switching element in each pixel, a structure using lateral electric field, such as IPS (In-Plane Switching) mode and FFS (Fringe Field Switching) mode is put to practical use. The liquid crystal display device using the lateral electric field mode is equipped with pixel electrodes and common electrodes formed in an array substrate, respectively. Liquid crystal molecules are switched by the lateral electric field substantially in parallel with the principal surface of the array substrate.

On the other hand, another technique is also proposed, in which the liquid crystal molecules are switched using the lateral electric field or an oblique electric field between the pixel electrode formed in the array substrate and the common electrode formed in a counter substrate. Especially, a technology which forms the lateral electric field or the oblique electric field is proposed by combining a cross-shaped or I shaped pixel electrode and the common electrode located above a source line.

BRIEF DESCRIPTION OF THE DRAWINGS

The accompanying drawings, which are incorporated in and constitute a portion of the specification, illustrate embodiments of the invention, and together with the general description given above and the detailed description of the embodiments given below, serve to explain the principles of the invention.

DETAILED DESCRIPTION

Figure 1:
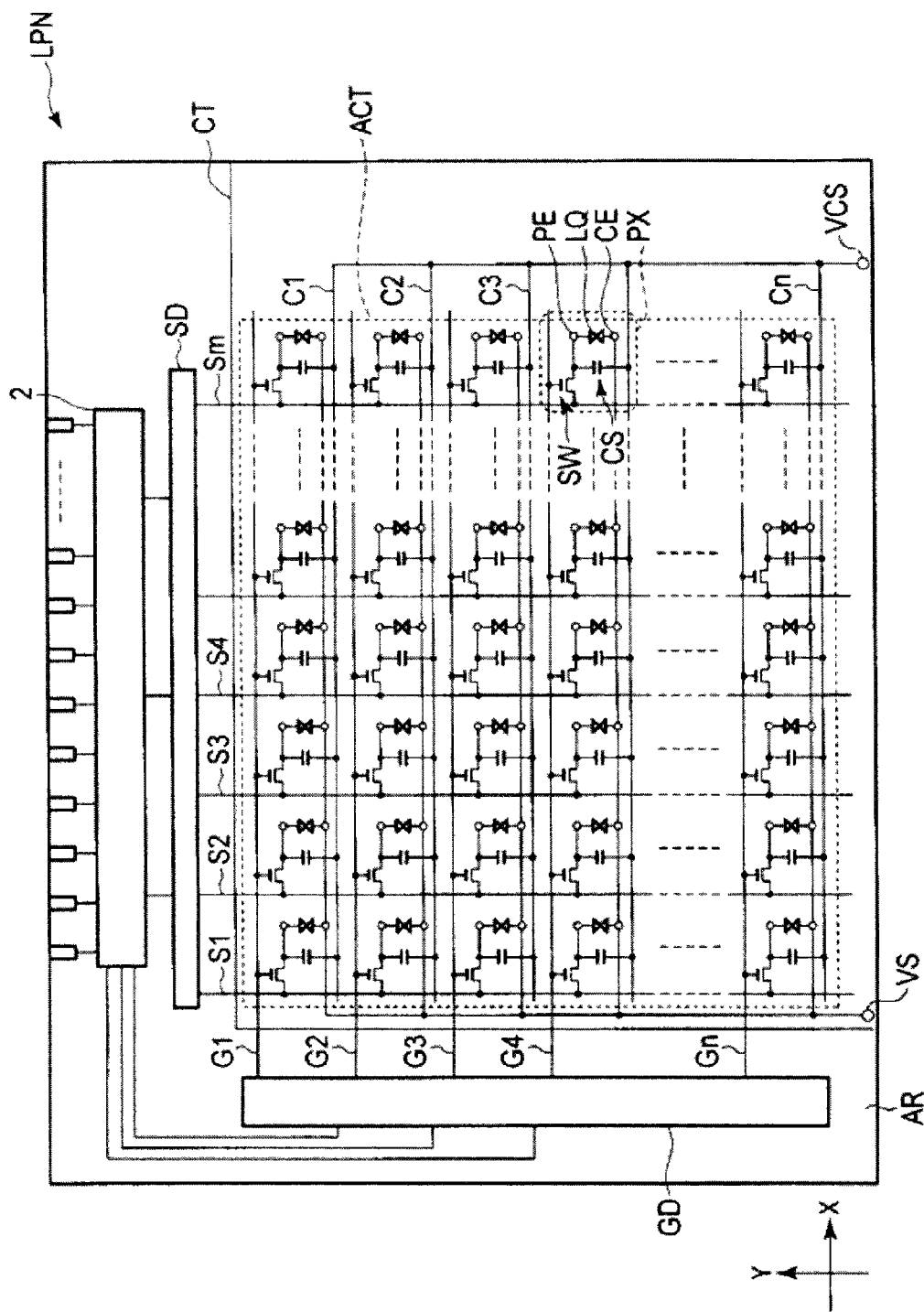
FIG. 1 is a figure schematically showing a structure and an equivalent circuit of a liquid crystal display device according to one embodiment.

A liquid crystal display device according to an exemplary embodiment of the present invention will now be described with reference to the accompanying drawings wherein the same or like reference numerals designate the same or corresponding portions throughout the several views.

According to one embodiment, a liquid crystal display device, comprises: a first substrate including; a gate line extending in a first direction, first, second and third source lines extending in a second direction crossing the first direction, a first interlayer insulating film arranged on the gate line and the first, second and third source lines, a first common electrode including a first sub-common electrode extending in the first direction on the first interlayer insulating film and facing the gate line, a second interlayer insulating film covering the first common electrode, a first pixel electrode provided in a first pixel and including a first main pixel electrode extending in the second direction on the second interlayer insulating film between the first source line and the second source line, and a second pixel electrode provided in a second pixel arranged adjoining the first pixel in the first direction and including a second main pixel electrode extending in the second direction on the second interlayer insulating film between the second source line and the third source line, a second common electrode including a second sub-common electrode and a second main common electrode set to the same potential as the first common electrode, wherein the second sub-common electrode extends on the second interlayer insulating film between the first source line and the second source line in the first direction so as to face the first sub-common electrode, and is cut out between the second source line and the third source line, and the second main common electrode extends in the second direction facing each of the first, second and third source lines, a second substrate arranged facing the first substrate; and a liquid crystal layer held between the first substrate and the second substrate.

According to other embodiment, a liquid crystal display device comprises: a first substrate including; first, second and third main common electrodes arranged in a first direction and extending in a second direction crossing the second direction, a sub-common electrode extending in the first direction and electrically coupling the first main common electrode with the second main common electrode, first and second pixel electrodes located between the first main common electrode and the second main common electrode, and adjoining in the second direction sandwiching the sub-common electrode, third and fourth pixel electrodes located between the second main common electrode and the third main common electrode, and adjoining in the second direction, and a first alignment film covering the first, second and third main common electrodes, the sub-common electrode, and the first, second, third and fourth pixel electrodes, wherein the respective lengths of the first and second pixel electrodes are shorter than the lengths of the third and fourth pixel electrodes in the second direction, and a second substrate equipped with a second alignment film facing the first alignment film; and a liquid crystal layer held between the first substrate and the second substrate.

According to other embodiment, a liquid crystal display device comprises: a first substrate including; first, second and third main common electrodes arranged in a first direction and extending in a second direction crossing the second direction, a first sub-common electrode extending in the first direction and electrically coupling the first main common electrode with the second main common electrode, first and second pixel electrodes located between the first main common electrode and the second main common electrode, and adjoining in the second direction sandwiching the sub-common electrode, third and fourth pixel electrodes located between the second main common electrode and the third main common electrode, and adjoining in the second direction, and a first alignment film covering the first, second and third main common electrodes, the sub-common electrode, and the first, second, third and fourth pixel electrodes, wherein a second sub-common electrode is not provided between the second main common electrode and the third main common electrode on a straight line extending along the first sub-common electrode in the first direction, and the distance between adjoining ends of the first pixel electrode and the second pixel electrode is longer than the distance between adjoining ends of the third pixel electrode and the fourth pixel electrode, a second substrate equipped with a second alignment film facing the first alignment film; and a liquid crystal layer held between the first substrate and the second substrate.

FIG. 1 is a figure schematically showing a structure and an equivalent circuit of a liquid crystal display device according to one embodiment.

The liquid crystal display device includes an active-matrix type liquid crystal display panel LPN. The liquid crystal display panel LPN is equipped with an array substrate AR as a first substrate, a counter substrates CT as a second substrate arranged opposing the array substrate AR, and a liquid crystal layer LQ held between the array substrate AR and the counter substrate CT. The liquid crystal display panel LPN is equipped with an active area ACT which displays images. The active area ACT is formed of a plurality of pixels PX arranged in a matrix shape.

The liquid crystal display panel LPN is equipped with a plurality of gate lines G (G1-Gn), a plurality of storage capacitance lines C (C1-Cn), a plurality of source lines S (S1-Sm), etc., in the active area ACT. The gate lines G and the storage capacitance lines C linearly extend in a first direction X, respectively. The gate lines G and the storage capacitance lines C are arranged in turns adjoining each other at intervals along a second direction Y that orthogonally intersects the first direction X. The source lines S linearly extend in the second direction Y, respectively, and cross the gate lines G and the storage capacitance lines C. The gate lines G, the storage capacitance lines C and the source lines S may not necessarily extend linearly, and a portion thereof may be crooked partly.

Each gate line G is pulled out to outside of the active area ACT, and connected to a gate driver GD. Each source line S is pulled out to the outside of the active area ACT, and connected to a source driver SD. At least portions of the gate driver GD and the source driver SD are formed in the array substrate AR, for example. The gate driver GD and the source driver SD are connected with a driver IC chip 2 provided in the array substrate AR and having an implemented controller.

Each pixel PX includes a switching element SW, a pixel electrode PE, a common electrode CE, etc. Storage capacitance Cs is formed, for example, between the storage capacitance line C and the pixel electrode PE. The storage capacitance line C is electrically connected with a voltage impressing portion VCS to which storage capacitance voltage is impressed.

The switching element SW is formed of an n channel type thin film transistor (TFT), for example. The switching element SW is electrically connected with the gate line G and the source line S. The switching element SW may be either a top-gate type or a bottom-gate type. Though the semiconductor layer of the switching element SW is formed of poly-silicon in this embodiment, the semiconductor layer may be formed of amorphous silicon.

The pixel electrode PE is arranged in each pixel PX and electrically connected with the switching element SW. The common electrode CE of common potential is arranged in common to the pixel electrodes PE of the plurality of pixels PX interposing the liquid crystal layer LQ therebetween. An electric power supply portion VS is formed outside of the active area ACT in the array substrate AR to impress a voltage to the common electrode CE. Furthermore, the common electrode CE is drawn to outside of the active area ACT and electrically connected with the electric power supply portion VS. The pixel electrode PE and the common electrode CE may be formed of transparent electric conductive materials, such as Indium Tin Oxide (ITO) and Indium Zinc Oxide (IZO), for example, or opaque line materials, such as aluminum (Al), titanium (Ti), silver (Ag), molybdenum (Mo), tungsten (W), copper (Cu), and chromium (Cr).

In addition, in the liquid crystal display panel LPN according to this embodiment, while the pixel electrode PE is formed in the array substrate AR, at least a portion of the common electrode CE is also formed in the array substrate AR or the counter substrate CT. Liquid crystal molecules of the liquid crystal layer LQ are switched mainly using an electric field formed between the pixel electrode PE and the common electrode CE. The electric field formed between the pixel electrode PE and the common electrode CE is an oblique electric field slightly oblique with respect to a X-Y plane specified by the first direction X and the second direction Y, i.e., the substrates (or lateral electric field substantially in parallel with the principal surface of the substrate surface).

Figure 2A:
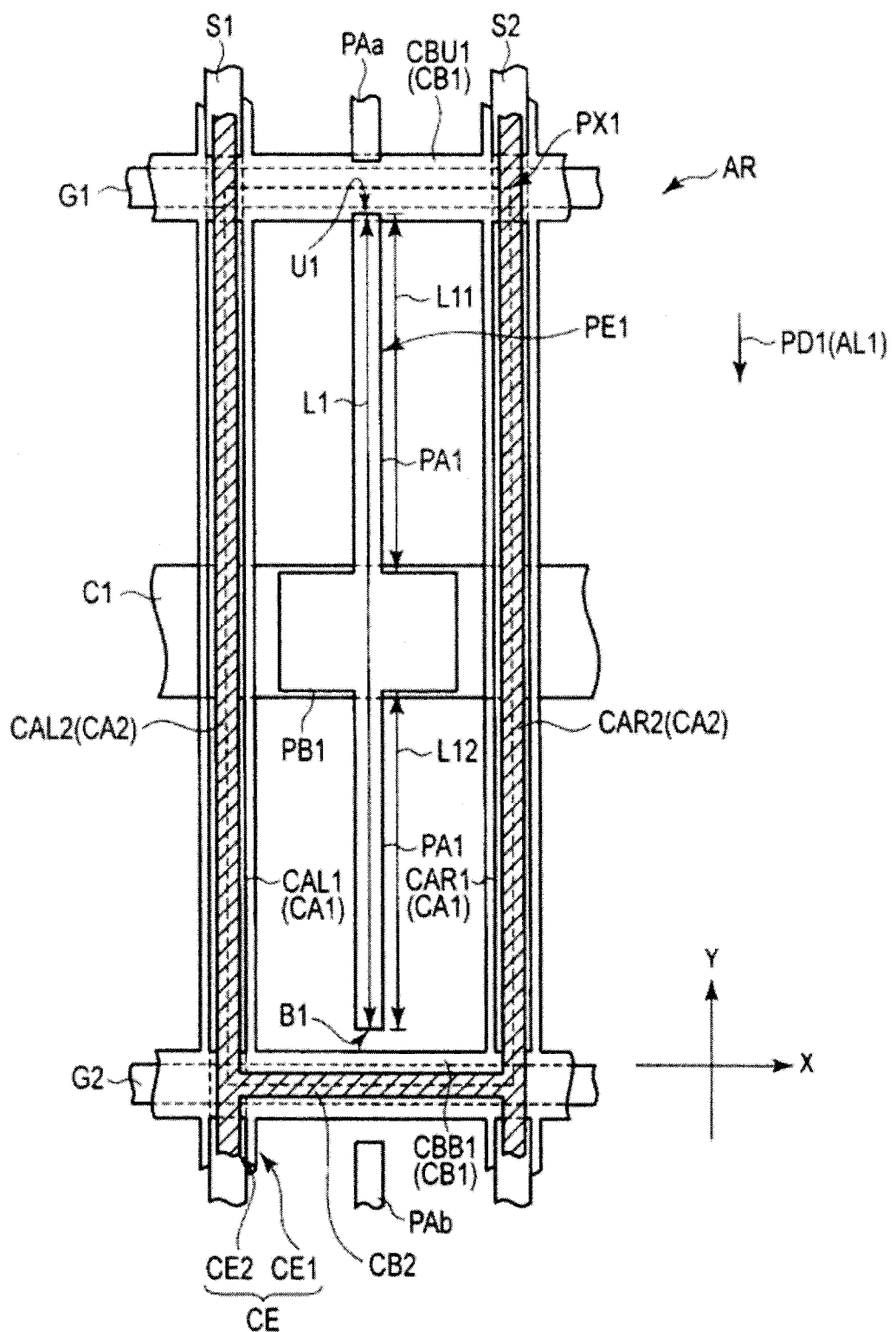
FIG. 2A is a plan view schematically showing a structure of one pixel PX when an array substrate AR shown in FIG. 1 is seen from a counter substrate side according to a first embodiment.
Figure 2B:
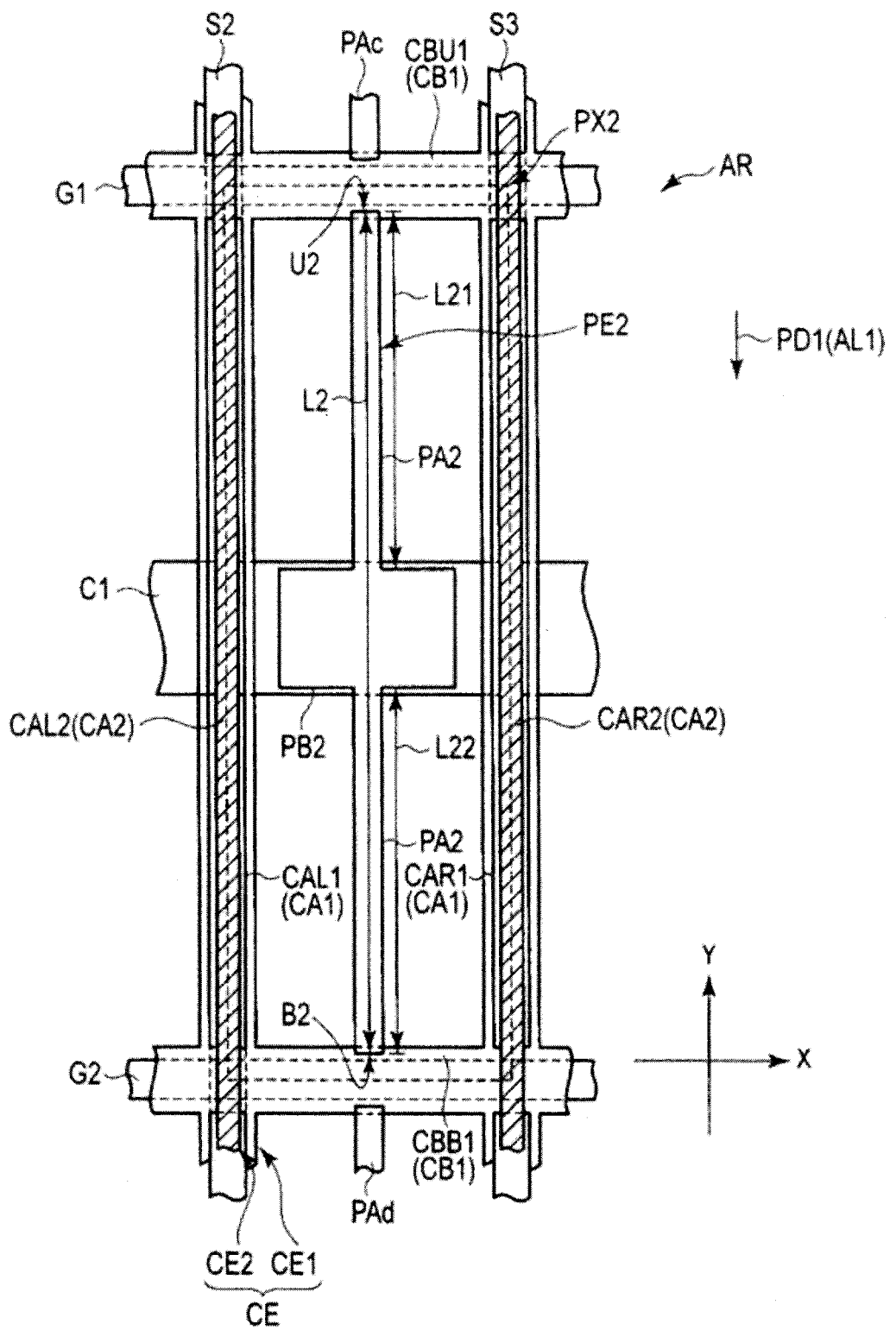
FIG. 2B is a plan view schematically showing a structure of other pixel PX when an array substrate AR shown in FIG. 1 is seen from a counter substrate side according to a first embodiment.

FIG. 2A is a plan view schematically showing a structure of one pixel PX when an array substrate AR shown in FIG. 1 is seen from a counter substrate side according to a first embodiment. FIG. 2B is a plan view schematically showing a structure of the counter substrate CT in other pixel PX shown in FIG. 1. Herein, a plan view is shown in a X-Y plane.

The array substrate AR is equipped with a gate line G1, a gate line G2, a storage capacitance line C1, a source line S1, a source line S2, a source line S3, a pixel electrode PE1, a pixel electrode PE2, first and second sub-common electrodes CE1 and CE2 included in the common electrode CE and a first alignment film AL1, etc.

The gate line G1 and the gate line G2 are arranged at intervals along the second direction Y, and extend in the first direction X, respectively. The storage capacitance line C1 is located substantially in the center between the gate line G1 and the gate line G2 and extends along the first direction X. In this embodiment, the storage capacitance line C1 is located in an approximately center portion between the gate line G1 and the gate line G2. The source line S1, the source line S2 and the source line S3 are arranged at intervals along the first direction X and extend in the second direction Y, respectively. The pixel electrode PE1 is arranged between the adjoining source line S1 and source line S2. In addition, the pixel electrode PE2 is arranged between the adjoining the source line S2 and source line S3.

In this embodiment, the pixel PX1 corresponds to a square region surrounded with the gate lines G1 and G2 and the source lines S1 and S2, and the pixel PX2 corresponds to a square region surrounded with the gate lines G1 and G2 and the source lines S2 and S3. The pixels PX1 and PX2 are respectively formed in a rectangular shape whose length in the first direction X is shorter than the length in the second direction Y as shown with a dashed line in FIGS. 2A and 2B. The length in the first direction X of the pixels PX1 and PX2 correspond to a pitch between the adjacent source lines in the first direction X, and the length in the second direction Y of the pixel PX corresponds to a pitch between the gate line G1 and the gate line G2 in the second direction Y.

The source line S1 is arranged at the left-hand side end in the pixel PX1. Precisely, the source line S1 is arranged striding over a boundary between the pixel PX1 and a pixel adjoining the pixel PX1 on the left-hand side. The source line S2 is arranged at the right-hand side end of the pixel PX1. Similarly, the source line S2 is arranged striding over a boundary between the pixel PX1 and the pixel PX2. The source line S3 is arranged at the right-hand side end of the pixel PX2. Similarly, the source line S3 is arranged striding over a boundary between the pixel PX2 and a pixel PX adjoining on its right hand side. Moreover, the gate lines G1 is arranged in upper end portions of the pixels PX1 and PX2. Precisely, the gate line G1, is arranged striding over a boundary between the pixels PX1 and PX2 and pixels adjoining the pixels PX1 and PX2 on the upper end side. The gate line G2 is arranged in a lower end portion of the pixels PX1 and PX2. The gate line G2 is arranged striding over a boundary between the pixels PX1 and PX2 and pixels adjoining the pixels PX1 and PX2 on the lower end side. The storage capacitance line C1 is arranged approximately in a central portion of the pixels PX1 and PX2. The switching element arranged corresponding to the pixel PX1 is electrically connected with the gate line G1 and the source line S1. The switching element arranged corresponding to the pixel PX2 is electrically connected with the gate line G1 and the source line S2, for example.

The pixel electrode PE1 is equipped with a main pixel electrode PA1 and a sub-pixel electrode PB1. The main pixel electrode PA1 and the sub-pixel electrode PB1 are integrally or continuously formed, and electrically connected mutually. The main pixel electrode PA1 is located in the approximately middle between the source line S1 and the source line S2, and linearly extends along the second direction Y. The main pixel electrode PA1 is formed in a stripe shape with the substantially same width along the first direction X. The sub-pixel electrode PB1 is located in the approximately middle between the gate line G1 and the gate line G2, and linearly extends along the first direction X to the circumferences of a left-hand side end (the position which overlaps with the source line S1) and the circumferences of a right-hand side end (the position which overlaps with the source line S2) in the pixel PX1. That is, the first sub-pixel electrode PB1 is located in the substantially central portion of the pixel PX1 and arranged in the position which overlaps with the storage capacitance line C1, and further crosses the main pixel electrode PA1 in the intermediate portion thereof in the second direction Y.

The pixel electrode PE2 is equipped with a main pixel electrode PA2 and a sub-pixel electrode PB2. The main pixel electrode PA2 and the sub-pixel electrode PB2 are integrally or continuously formed, and electrically connected mutually. The main pixel electrode PA2 is located in the approximately middle between the source line S2 and the source line S3, and linearly extends along the second direction Y. The main pixel electrode PA2 is formed in a stripe shape with the substantially same width along the first direction X. The sub-pixel electrode PB2 is located in the approximately middle between the gate line G1 and the gate line G2, and linearly extends along the first direction X to the circumferences of a left-hand side end (the position which overlaps with the source line S2) and the circumferences of a right-hand side end (the position which overlaps with the source line S3) in the pixel PX2. That is, the sub-pixel electrode PB2 is located in the substantially central portion of the pixel PX2 and arranged in the position which overlaps with the storage capacitance line C1, and further crosses the main pixel electrode PA2 in the intermediate portion thereof in the second direction Y.

The pixel electrode PE1 and the pixel electrode PE2 shown herein are formed in a crossed shape. Though the sub-pixel electrode PB1 and the sub-pixel PB2 are formed in a stripe shape so as to have the same width along the second direction Y, the shape is not restricted to the illustrated example. The pixel electrode PE1 is electrically connected with the switching element through the sub-pixel electrode PB1 at the position which overlaps with the storage capacitance line C1, and the pixel electrode PE2 is electrically connected with the switching element through the sub-pixel electrode PB2 at the position which overlaps with the storage capacitance line C1.

Herein, its attention is paid to the main pixel electrode PA1 and the main pixel electrode PA2. The main pixel electrode PA1 includes one end portion U1 located on the gate line G1 side, and the other end portion B1 located on the gate G2 side. The one end portion U1 is located near the upper end portion (in the circumferences of the position overlapping with the gate line G1) of the pixel PX1. The other end portion B1 is located apart from the bottom end portion (the position overlapping with the gate line G2) of pixel PX1. In the main pixel electrode PA1, the length L11 from the sub-pixel electrode PB1 to the one end portion U1 is longer than the length L12 from the sub-pixel electrode PB1 to the other end portion B1. The main pixel electrode PA2 includes one end portion U2 located on the gate line G1 side and the other end portion B2 located on the gate line G2 side. The one end portion U2 is located in the circumferences of the upper end portion (the circumferences of the position overlapping with the gate line G1) of the pixel PX2. The other end portion B2 is located in the circumferences of the bottom end portion (the circumferences of the position overlapping with the gate line G2) of the pixel PX2. In the main pixel electrode PA2, the length L21 from the sub-pixel electrode PB2 to the one end portion U2 is equivalent to the length L22 from the sub-pixel electrode PB2 to the other end portion B2. That is, while the one end portion U1 of the main pixel electrode PA1 is located substantially in the same position as the one end portion U2 of the main pixel electrode PA2 on the same straight line in the first direction X, the other end portion B1 of the main pixel electrode PA1 is arranged in a position more apart from the gate line G2 rather than other end portion B2 of the main pixel electrode PA2 is arranged. Therefore, the length L1 from the one end portion U1 to the other end portion B1 of the main pixel electrode PA1 in the second direction Y is shorter than the length L2 from the one end portion U2 to the other end portion B2 of the main pixel electrode PA2 in the second direction Y.

The first common electrode CE1 is equipped with a first main common electrode CA1 and a first sub-common electrode CB1. The first main common electrode CA1 and the first sub-common electrode CB1 are integrally or continuously formed, and electrically connected mutually. The first main common electrode CA1 linearly extends along the second direction Y, and the first sub-common electrode CB1 linearly extends along the first direction X. That is, the first common electrode CE1 is formed in the shape of a lattice defining pixels PX1 and PX2 by the first main common electrode CA1 and the first sub-common electrode CB1.

The first main common electrode CA1 extends along the source lines S1 to S3, respectively. The first main common electrode CA1 is located on the both sides sandwiching the main pixel electrodes PA1 and PA2 in the X-Y plane, respectively. In the first pixel PX1, the first main common electrode CA1 is arranged on the pixel electrode PE1 side rather than the position which overlaps with the source lines S1 and S2. Furthermore, in the pixel electrode PX2, the first main common electrode CA1 is arranged on the pixel electrode PE2 side rather than a position overlapping the source lines S2 and S3, i.e., the first main common electrode CA1 is arranged on the both sides sandwiching one source line S in the X-Y plane. The first main common electrode CA1 is formed in a stripe shape with the same width along the first direction X.

In this embodiment shown in FIG. 2A, the first main common electrode CA1 is equipped with a first main common electrode CAL1 located in the left-hand side end, and a first main common electrode CAR1 located in the right-hand side end of the pixel PX1. While the first main common electrode CAL1 extends along the source line S1 and is arranged on the pixel electrode PE side rather than the position which overlaps with the source line S1, a portion thereof may be arranged overlapping with the source line S1. Similarly, while the first main common electrode CAR1 extends along the source line S2 and is arranged on the pixel electrode PE side rather than the position which overlaps with the source line S2, a portion thereof may be arranged overlapping with the source line S2.

The first sub-common electrode CB1 extends along the first direction X and faces the gate lines G1 and G2. The first sub-common electrode CB1 is formed in a stripe shape with the substantially same width in the second direction Y. In this embodiment, the first sub-common electrode CB1 includes a first sub-common electrode CBU1 located in the upper end portion of the pixels PX1 and PX2 and facing the gate line G1, and a first sub-common electrode CBB1 located in the bottom end portion of the pixels PX1 and PX2 and facing the gate line G2.

The second common electrode CE2 is equipped with a second main-common electrode CA2 and a second sub-common electrode CB2. The second main common electrode CA2 and the second sub-common electrode CB2 are integrally or continuously formed, and electrically connected with mutually. The second main common electrode CA2 linearly extends along the second direction Y, and the second sub-common electrode CB2 linearly extends along the first direction X. The first common electrode CE1 and the second common electrode CE2 are arranged apart from the pixel electrodes PE1 and PE2, and surround the pixel electrodes PE1 and PE2, respectively. The first common electrode CE1 and the second common electrode CE2 are electrically connected with mutually, and further connected with the electric power supply portion VS in the outside of the active area ACT, and set to the same potential each other.

The second main common electrode CA2 is located above the source lines S1-S3, and extends in parallel with the first main common electrode CA1. The second main common electrode CA2 is located on the both sides sandwiching the first main pixel electrodes PA1 and PA2, respectively, in the X-Y plane. The second main common electrode CA2 is formed in a stripe shape with substantially the same width along the first direction X. The electrode width of the second main common electrode CA2 in the first direction X is smaller than the line widths of the source lines S1-S3 in the first direction X, for example.

In this embodiment shown in FIG. 2A, the second main common electrode CA2 includes a second main common electrode CAL2 located on the left-hand side of the pixel PX1 and arranged striding over a boundary between the pixel PX1 and a pixel PX adjoining on its left-hand side, and a second main common electrode CAR2 located on the right-hand side of the pixel PX and arranged striding over a boundary between the pixel PX1 and the pixel PX2 on the right-hand side. The second main common electrode CAL2 faces the source line S1, and extends in parallel with the first main common electrode CAL1. The second main common electrode CAR2 faces the source line S2, and extends in parallel with the first main common electrode CAR1. In addition, in the pixel PX2 shown in FIG. 2B, the second main common electrode CAL2 faces the source line S2, and the second main common electrode CAR2 faces the source line S3.

While the second sub-common electrode CB2 extends along the first direction X and is located above the gate line G, the second sub-common electrode CB2 faces the first sub-common electrode CB1. The second sub-common electrode CB2 is formed in a stripe shape with substantially the same width in the second direction Y. In this embodiment shown in FIG. 2A, the second sub-common electrode CB2 is located in the lower portion of the pixel PX1 and extends along the gate line G2 so as to face the first sub-common electrode CBB1. On the other hand, the second sub-common electrode is not formed in a position facing the first sub-common electrode CBU1 in the upper end portion in the pixel PX1. In addition, in the pixel PX2, the second sub-pixel electrode is formed neither in the upper and lower end portions. That is, while the second sub-common electrode CB2 faces the first sub-common electrode CBB1 between the source line S1 and the source line S2, the second sub-common electrode CB2 is cut out between the source line S2 and the source line S3.

Furthermore, in the embodiment shown in FIG. 2A, a main pixel electrode PAa and a main pixel electrode PAb arranged in other pixels adjoin the first main pixel electrode PA1 in the second direction Y, respectively, and are located on the same straight line along which the first main pixel electrode PA1 extends. While the second sub-common electrode CB2 is located between the main pixel electrode PA1 and the main pixel electrode PAb, the second sub-common electrode CB2 is cut out between the main pixel electrode PA1 and the main pixel electrode PAa. In the embodiment shown in FIG. 2B, a main pixel electrode PAc and the main pixel electrode PAd in other pixels PX adjoin the main pixel electrode PA2 in the second direction Y, and are located on the same straight line along which the main pixel electrode PA2 extends. The second sub-common electrode CB2 is cut out between the main pixel electrode PA2 and the main pixel electrode PAc, and between the main pixel electrode PA2 and main pixel electrode PAd.

In the array substrate AR, the pixel electrode PE1, the pixel electrode PE2 and the second common electrode CE2 are covered with a first alignment film AL1 Alignment treatment is performed to the first alignment film AL1 along a first alignment direction PD1 to initially align the liquid crystal molecules of the liquid crystal layer LQ. The first alignment direction PD1 is substantially in parallel with the second direction Y.

Figure 2C:
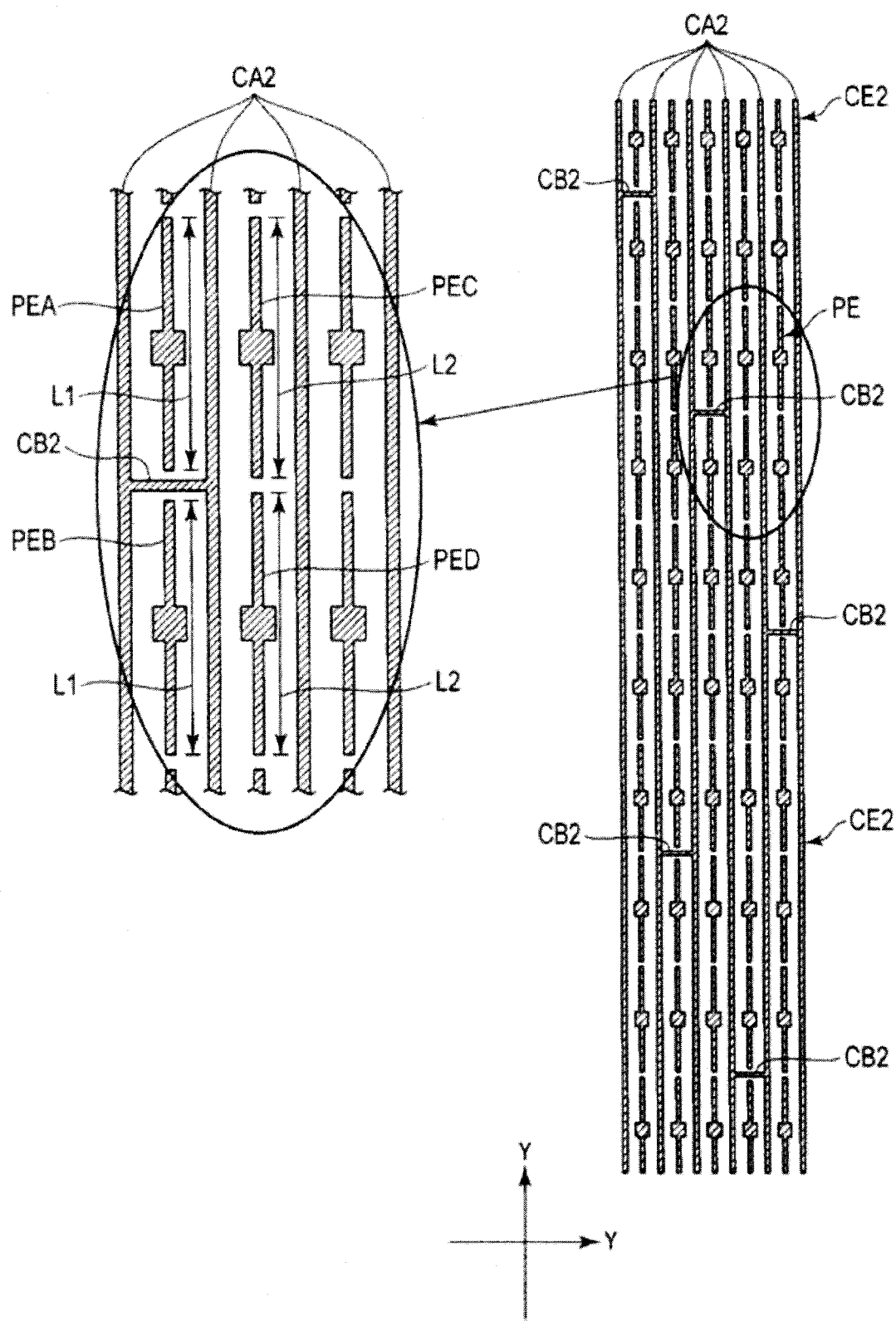
FIG. 2C is a plan view schematically showing layouts of a second common electrode CE2 and a pixel electrode PE.

FIG. 2C is a plan view schematically showing layouts of the second common electrode CE2 and the pixel electrode PE.

The second common electrode CE2 includes a second main common electrode CA2 extending in the second direction Y and a second sub-common electrode CB2 extending in the first direction X. Each of the second main common electrodes CA2 is connected with the second sub-common electrode CB2 that is formed in a scattered state. That is, the position where the second sub-common electrode CB2 is arranged is distributed. In this embodiment, the sub-common electrode CB2 is connected with two adjoining second main common electrodes CA2, however is not connected continuously with three or more second main common electrodes CA2.

The pixel electrodes PE are arranged in the first direction X and the second direction Y in the shape of a matrix. The pixel electrodes PE arranged in the same column line in the second direction Y are located between adjoining two second main common electrodes CA2. As shown in an enlarged figure surrounded with a circle, while the pixel electrode PEA and the pixel electrode PEB which adjoin in the second direction Y on the both sides of the second sub-common electrode CB2 are formed so as to have a length L1 in the second direction Y, the pixel electrode PEC and the pixel electrode PED adjoining in the second direction Y without the second sub-common electrode arranged therebetween have a length L2 longer than the length L1 in the second direction Y, respectively.

Figures 3A, 3B, 3C:
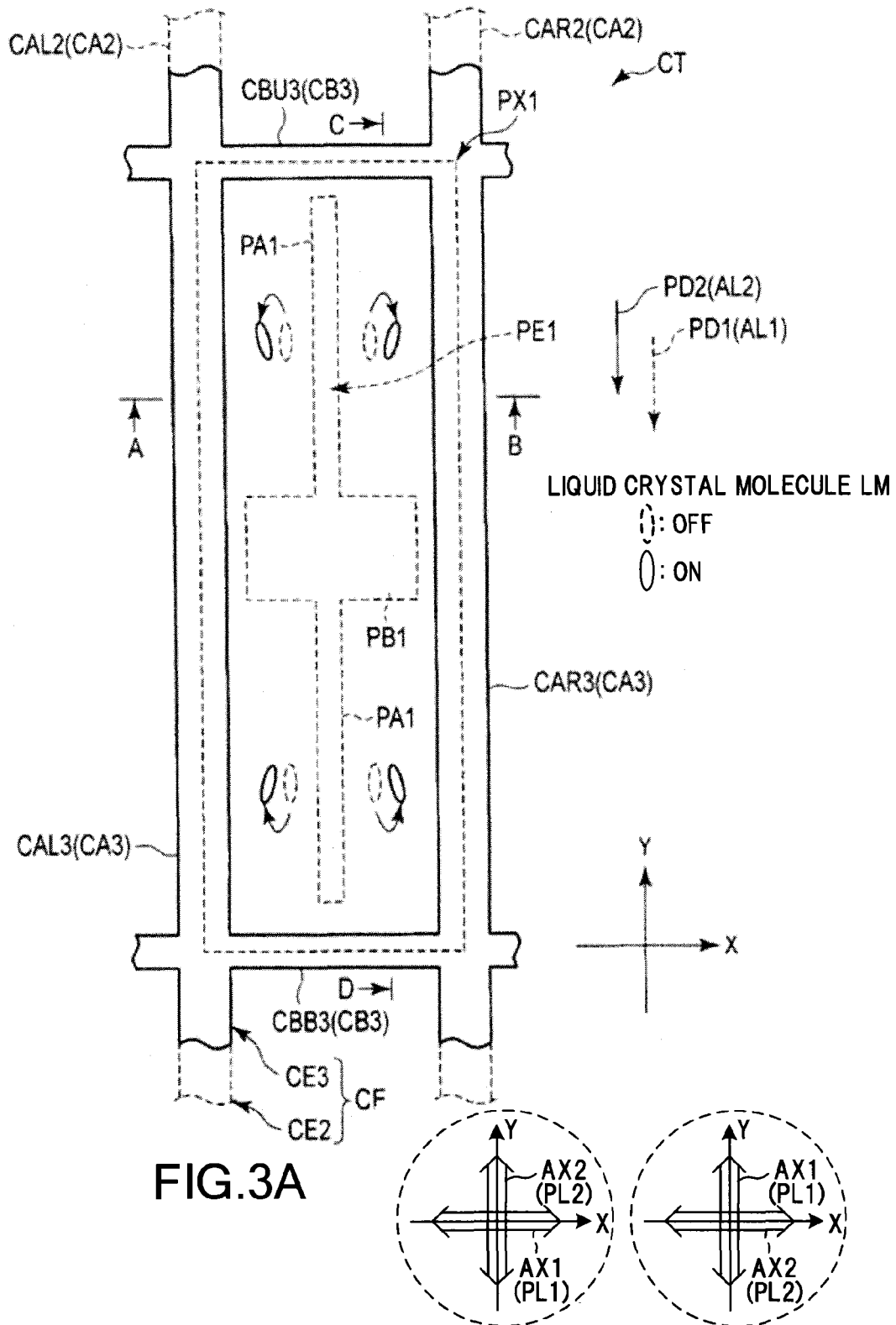
FIG. 3A is a plan view schematically showing a structure of the counter substrate CT in one pixel PX shown in FIG. 1.
FIGS. 3B and 3C are figures showing polarizing axes, respectively.

FIG. 3A is a plan view schematically showing a structure of the counter substrate CT in one pixel PX shown in FIG. 1. Herein, the plan view in the X-Y plane is shown. In addition, only structure required for explanation is illustrated, and only the first pixel electrode PE1 and the second common electrode CE2 in the array substrate are shown with a dashed line.

The counter substrate CT is equipped with a third common electrode CE3 included in the common electrode CE. The third common electrode CE3 includes a third main common electrode CA3 and a third sub-common electrode CB3. The third main common electrode CA3 and the third sub-common electrode CB3 are integrally or continuously formed, and electrically connected mutually. The third main common electrode CA3 linearly extends along the second direction Y, and the third sub-common electrode CB3 linearly extends along the first direction X. That is, the third common electrode CE3 is formed in a lattice shape defining the pixel PX1 by the third main common electrode CA3 and the third sub-common electrode CB3. In addition, though not shown, the third main common electrode CE3 is formed in a lattice shape also defining the pixel PX2. The third common electrode CE3 is electrically connected with the first common electrode CE1 and the second common electrode CE2 in the outside of the active area, etc., for example, and set to the same potential as the first and second common electrodes CE1 and CE2.

The third main common electrode CA3 faces the second main common electrode CA2 and extends in parallel with the second main common electrode CA2. The third main common electrode CA3 is formed in a stripe shape with the substantially same width along the first direction X. The width of the third main common electrode CA3 is substantially the same as the second main common electrode CA2, for example, and smaller than the width of the source line S. In this embodiment, the third main common electrode CA3 includes a third main common electrode CAL3 located in the left-hand side end of the pixel PX1, and formed striding over a boundary between the pixel PX1 and a pixel PX adjoining on its left-hand side, and a third main common electrode CAR3 located in the right-hand side end of the pixel PX1, and formed striding over a boundary between the pixel PX1 and a pixel PX adjoining on its right-hand side. The third main common electrode CAL3 faces the second main common electrode CRL2, and the third main common electrode CAR3 faces the second main common electrode CAR2.

The third sub-common electrode CB3 is formed in a stripe shape along the second direction Y with the substantially the same width. The width of the third sub-common electrode CB3 is substantially the same as the second sub-common electrode CB2, and smaller than the width of the gate line G, for example. In this embodiment, the third sub-common electrode CB3 includes a third sub-common electrode CBU3 located in the upper-side end portion of the pixel PX1, and formed striding over a boundary between the pixel PX1 and a pixel PX adjoining on its upper side, and a third sub-common electrode CBB3 located in the lower-side end portion of the pixel PX1, and formed striding over a boundary between the pixel PX1 and a pixel PX adjoining on its lower side. The third sub-common electrode CBU3 faces the second sub-common electrode CBU2

In the counter substrate CT, the third common electrode CE3 is covered with a second alignment film AL2. In order to initially align the liquid crystal molecules of the liquid crystal layer LQ, alignment treatment is performed to the second alignment film AL2 along with a second alignment direction PD2. The second alignment treatment direction PD2 is in parallel to the first alignment treatment direction PD1. In this embodiment, the second alignment treatment direction PD2 is the same direction as the first alignment treatment direction PD1. In addition, the first alignment treatment direction PD1 and the second alignment treatment direction PD2 may be opposite directions mutually, and further be the same directions mutually which are opposite directions to the directions illustrated in the figure, that is, a direction which extends to the gate line G1 from the gate line G2.

Figure 4:
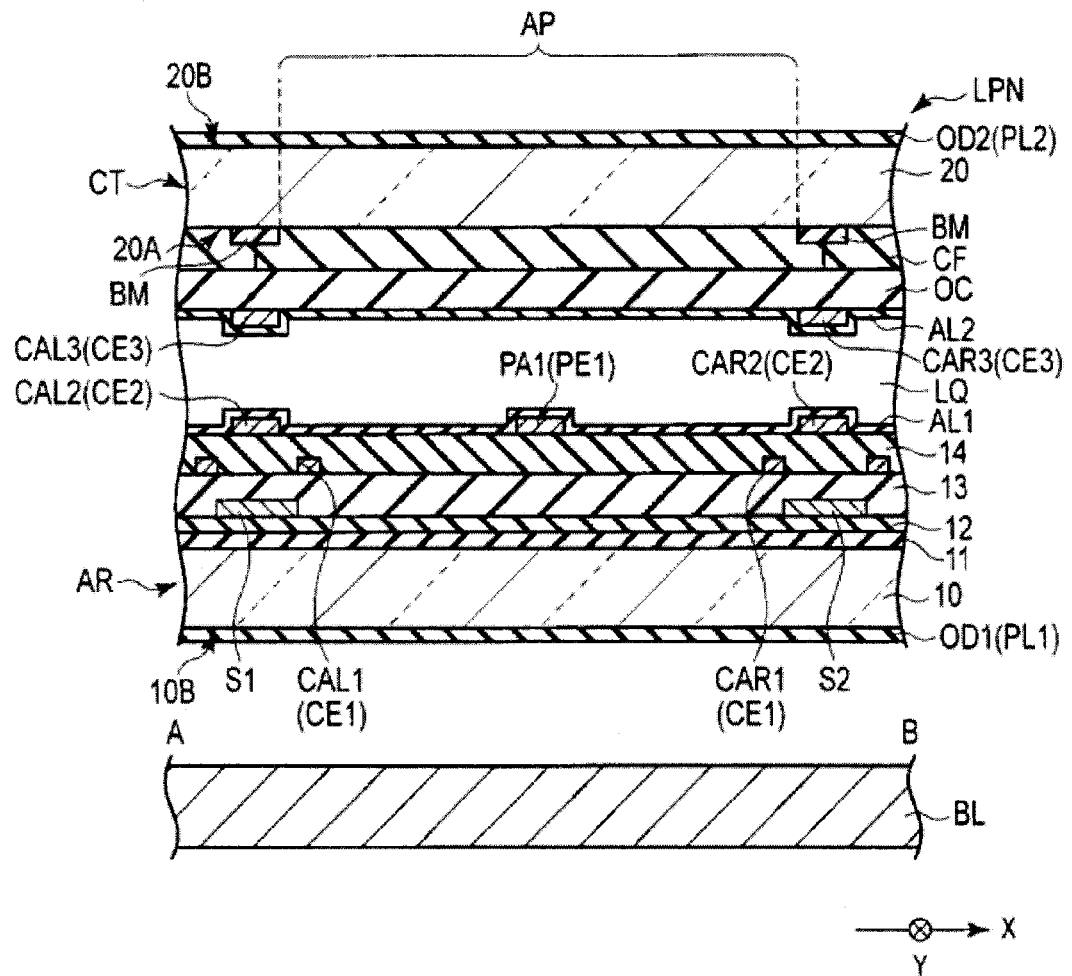
FIG. 4 is a cross-sectional view schematically showing the structure of the liquid crystal display panel LPN taken along line A-B shown in FIG. 3A.
Figure 5:
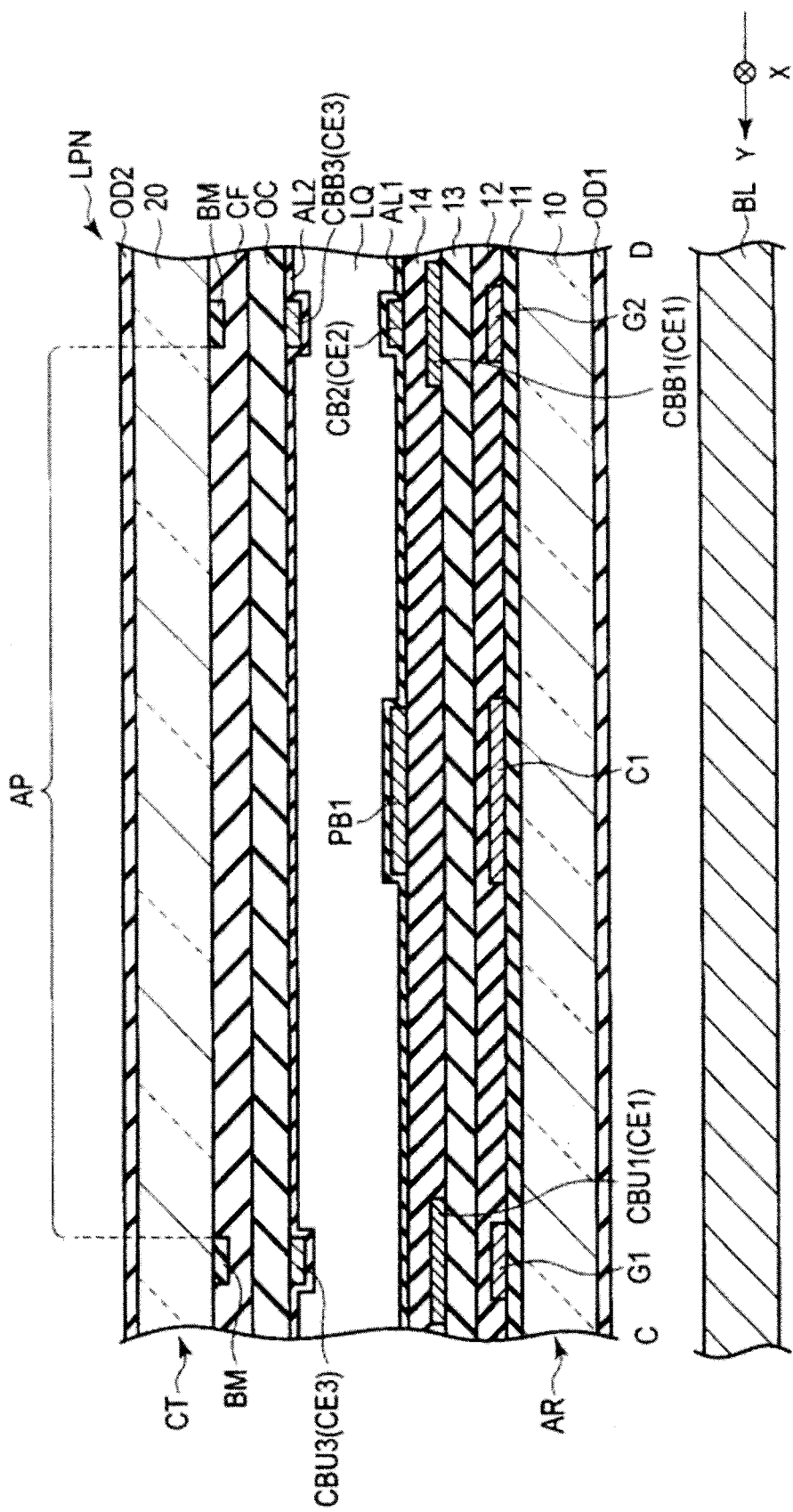
FIG. 5 is a cross-sectional view schematically showing the structure of the liquid crystal display panel LPN taken along line C-D shown in FIG. 3A.

FIG. 4 is a cross-sectional view schematically showing the structure of the liquid crystal display panel LPN taken along line A-B shown in FIG. 3A. FIG. 5 is a cross-sectional view schematically showing the structure of the liquid crystal display panel LPN taken along line C-D shown in FIG. 3A. Herein, though only the portion of the pixel PX1 required for explanation is illustrated, it is not needed to say that the structure of the pixel PX2 is almost the same as the pixel PX1.

A backlight unit BL is arranged on the back side of the array substrate AR forming the liquid crystal panel PNL. Various types of backlight unit BL can be used, and the explanation about its detailed structure is omitted.

The array substrate AR is formed using a first transparent insulating substrate 10. The array substrate AR includes the gate line G1, the gate line G2, the storage capacitance line C1, the source line S1, the source line S2, the pixel electrode PE1, the first common electrode CE1, the second common electrode CE2, a first insulating film 11, a second insulating film 12, a third insulating film 13, a fourth insulating film 14, and the first alignment film AL1, etc., on an internal surface of the first insulating substrate 10 facing the counter substrate CT.

The semiconductor layer of the switching element which is not illustrated is formed between the first insulating substrate 10 and the first insulating film 11. The storage capacitance line C1, the gate line G1, and the gate line G2 are formed on the first insulating film 11 and covered with the second insulating film 12. The source line S1 and the source line S2 are formed on the second insulating film 12 and covered with the third insulating film 13. The third insulating film 13 is equivalent to a first interlayer insulating film located on the gate line G1, the gate line G2, the source line S1 and the source line S2.

The first main common electrode CAL1, the first main common electrode CAR1, the first sub-common electrode CBU1 and the first sub-common electrode CBB1 of the first common electrode CE1 are formed on the third insulating film 13, and covered with the fourth insulating film 14. The fourth insulating film 14 is equivalent to a second interlayer insulating film that covers the first common electrode CE1. The third insulating film 13 and the fourth insulating film 14 are formed of inorganic system materials, such as a transparent resin material and a silicon nitride, for example. The first main common electrode CAL1 is formed in a position shifted from right above the source line S1, and the first main common electrode CAR1 is formed in a position shifted from right above the source line S2. The first sub-common electrode CBU1 faces the gate line G1 interposing the second insulating film 12 and the third insulating film 13 therebetween. The first sub-common electrode CBB1 faces the gate line G2 interposing the second insulating film 12 and the third insulating film 13 therebetween.

The first main pixel electrode PA1 and the sub-pixel electrode PB1 of the pixel electrode PE1, and the second main common electrode CAL2, the second main common electrode CAR2, the second sub-common electrode CB2 are formed on the fourth insulating film 14, and covered with the first alignment film AL1 The first main pixel electrode PA1 is located between the second main common electrode CAL2 and the second main common electrode CAR2. The first sub-pixel electrode PB1 faces the storage capacitance line C1 interposing the second insulating film 12, the third insulating film 13 and the fourth insulating film 14 therebetween. The second main common electrode CAL2 faces the source line S1 interposing the third insulating film 13 and the fourth insulating film 14 therebetween. The second main common electrode CAR2 faces the source line S2 interposing the third insulating film 13 and the fourth insulating film 14 therebetween. The second sub-common electrode CB2 is located above the gate line G2, and faces the first sub-common electrode CBB1 interposing the fourth insulating film 14 therebetween.

The first alignment film AL1 is arranged on the array substrate AR facing the counter substrate CT, and extends to whole active area ACT. The first alignment film AL1 covers the pixel electrodes PE1 and the second common electrode CE2, and is arranged also on the fourth insulating film 14. The first alignment film AL1 is formed of the material which shows a horizontal alignment characteristics.

The counter substrate CT is formed using a second transparent insulating substrate 20. The counter substrate CT includes a black matrix BM, a color filter CF, an overcoat layer OC, a third common electrode CE3, and a second alignment film AL2, etc., on an internal surface of the second insulating substrate 20 facing the array substrate AR.

The black matrix BM is formed on an internal surface 20A of the second insulating substrate 20 facing the array substrate AR and defines each pixel PX1. The black matrix BM forms an aperture AP facing the pixel electrode PE1. That is, the black matrix BM is arranged so that wiring portions, i.e., the source line S, the gate line G and the switching element SW may face the black matrix BM. Herein, the black matrix BM includes a portion located above the source lines S1 and S2 extending along the second direction Y and a portion located above the gate lines G1 and G2 extending along the first direction X, and is formed in the shape of a lattice.

The color filter CF is arranged corresponding to the pixel PX1. That is, while the color filter CF is arranged in the aperture AP defined by the black matrix BM on the internal surface 20A of the second insulating substrate 20, a portion thereof extends on the black matrix BM. The colors of the color filters CF arranged in adjacent pixels PX in the first direction X differ mutually. For example, the color filters CF are formed of resin materials colored by three primary colors of red, blue, and green, respectively. The red color filter formed of the resin material colored in red is arranged corresponding to a red pixel. The blue color filter formed of the resin material colored in blue is arranged corresponding to a blue pixel. The green color filter formed of the resin material colored in green is arranged corresponding to a green pixel. The boundary between the adjacent color filters CF is located in a position which overlaps with the black matrix BM.

The overcoat layer OC covers the color filter CF. The overcoat layer OC eases influence of concave-convex of the surfaces of the color filter CF and the black matrix BM. The overcoat layer OC is formed of a transparent resin material, for example.

The third main common electrodes CAL3 and CAR3 and the third sub-common electrodes CBU3 and CBB3 of the third common electrode CE3 are formed on the overcoat layer OC facing the array substrate AR, and located under the black matrix BM. The third main common electrode CAL3 is located above the source line S1 and faces the second main common electrode CAL2. The third main common electrode CAR3 is located above the source line S2 and faces the second main common electrode CAR2. The third sub-common electrode CBU3 is located above the gate line G1 and faces the first sub-common electrode CBU1. The third sub-common electrode CBB3 is located above the gate line G2 and faces the second sub-common electrode CB2. In the above-mentioned aperture AP, the domains among the first pixel electrode PE1, the first common electrode CE1, the second common electrode CE2 and the third common electrode CE3 correspond to transmissive domains which penetrate the backlight.

The second alignment film AL2 is arranged on the counter substrate CT facing the array substrate AR, and extends to whole active area ACT. The second alignment film AL2 covers the third common electrode CE2 and the overcoat layer OC, etc. The second alignment film AL2 is formed of the materials having horizontal alignment characteristics.

The array substrate AR and the counter substrate CT as mentioned-above are arranged so that the first alignment film AL1 and the second alignment film AL2 face each other. In this case, a pillar-shaped spacer is formed integrally with one of the substrates by resin materials between the first alignment film AL1 on the array substrate AR and the second alignment film AL2 on the counter substrate CT. Thereby, a predetermined gap, for example, a 2-7 µm cell gap, is formed. The array substrate AR and the counter substrate CT are pasted together by seal material arranged outside the active area ACT, while the predetermined cell gap is formed, for example. The liquid crystal layer LQ is held in the cell gap formed between the array substrate AR and the counter substrate CT, i.e., between the first alignment film AL1 and the second alignment film AL2. The liquid crystal layer LQ contains liquid crystal molecules LM. For example, the liquid crystal layer LQ is formed of liquid crystal material whose dielectric anisotropy is positive (posi-type).

A first optical element OD1 is attached on an external surface 10B of the array substrate AR, i.e., the external surface of the first insulating substrate 10 which forms the array substrate AR by adhesives, etc. The first optical element OD1 is located on a side which faces the backlight unit BL of the liquid crystal display panel LPN, and controls the polarization state of the incident light which enters into the liquid crystal display panel LPN from the backlight unit BL. The first optical element OD1 includes a first polarization plate PL1 having a first polarizing axis AX1. Other optical elements such as retardation film may be arranged between the first polarization plate PL1 and the first insulating substrate 10.

A second optical element OD2 is attached on an external surface 20B of the counter substrate CT, i.e., the external surface of the second insulating substrate 20 which forms the counter substrate CT by adhesives, etc. The second optical element OD2 is located on a display surface side of the liquid crystal display panel LPN, and controls the polarization state of emitted light from the liquid crystal display panel LPN. The second optical element OD2 includes a second polarization plate PL2 having a second polarizing axis AX2. Other optical elements such as retardation film may be arranged between the second polarization plate PL2 and the second insulating substrate 20.

The first polarizing axis AX1 of the first polarization plate PL1 and the second polarizing axis AX2 of the second polarization plate PL2 are arranged in the Crossed Nichol relationship. In the example shown in FIG. 3B, the first polarization plate PL1 is arranged so that the first polarizing axis AX1 is set to become in parallel with the first direction X, and the second polarization plate PL2 is arranged so that the second polarizing axis AX2 is set in parallel with the second direction Y. In the example shown in FIG. 3C, the second polarization plate PL2 is arranged so that the second polarizing axis AX2 is set in parallel with the first direction X, and the first polarization plate PL1 is arranged so that the first polarizing axis AX1 is set in parallel with the second direction Y.

Next, operation of the liquid crystal display panel LPN with the above-mentioned structure is explained. At the time of non-electric field state (OFF), i.e., when potential difference (i.e., electric field) is not formed between the pixel electrode PE and the common electrode CE (first common electrode CE1, second common electrode CE2, third common electrode CE3), the liquid crystal molecules LM of the liquid crystal layer LQ are initially aligned so that their long axes are aligned substantially in parallel with the second direction Y as shown with a dashed line in FIG. 3A. The time OFF corresponds to an initial alignment state, and the alignment direction of the liquid crystal molecules LM at the time of OFF corresponds to the initial alignment direction.

At the time of OFF, a portion of the backlight from the backlight BL penetrates the first polarization plate PL1, and enters into the liquid crystal display panel LPN. The backlight which entered into the liquid crystal display panel LPN becomes linearly polarized light which intersects perpendicularly with the first polarizing axis AX1 of the first polarization plate PL1. The polarization state of the linearly polarized light does hardly change when the backlight passes the liquid crystal layer LQ at the time OFF. For this reason, the linearly polarized light which penetrates the liquid crystal display panel LPN is absorbed by the second polarization plate PL2 which is arranged in the Crossed Nichol positional relationship with the first polarization plate PL1 (black display).

On the other hand, in the state (at the time of ON), i.e., the state where electric field is formed between the pixel electrode PE and the common electrode CE (voltage is impressed to the liquid crystal layer LQ), lateral electric field substantially in parallel with the substrates (or oblique electric field) is formed between the pixel electrode PE and the common electrode CE. The liquid crystal molecule LM is influenced by the electric field between the pixel electrode PE and the common electrode CE, and the alignment state changes. That is, the long axes of the liquid crystal molecules LM rotate in a plane substantially in parallel with the X-Y plane as shown with a dashed line in the figure. Thereby, in the pixel PX, the penetration domain which can penetrate backlight is formed between the pixel electrode PE and the common electrode CE.

In the embodiment shown in FIG. 3A, in the lower half region between the first pixel electrode PE1 and the third main common electrode CAL3 in the pixel PX, the liquid crystal molecule LM mainly rotates clockwise to the second direction Y, and turns to the lower left in the figure. Furthermore, in the upper half region of the pixel PX, the liquid crystal molecule LM mainly rotates counterclockwise to the second direction Y, and turns to the upper left in the figure. In the lower half region between the pixel electrode PE1 and the third main common electrode CAR3 in the pixel PX, the liquid crystal molecule LM mainly rotates counterclockwise to the second direction Y, and turns to the lower right in the figure. Furthermore, in the upper half region of the pixel PX, the liquid crystal molecule LM mainly rotates clockwise to the second direction Y, and turns to the upper right in the figure. Thus, in each pixel PX, at the time ON when the electric field is formed between the pixel electrode PE and the common electrode CE, the alignment direction of the liquid crystal molecule is divided into a plurality of directions with respect to the region in which the liquid crystal molecule LM overlaps with the pixel electrode PE1, and domains are formed corresponding to each alignment direction. That is, a plurality of domains is formed in each pixel PX.

At the time of ON, the polarization state of the linearly polarized light which entered into the liquid crystal display panel LPN changes when passing the liquid crystal layer LQ in accordance with the alignment state of the liquid crystal molecule LM. For this reason, at the time of ON, at least a portion of the backlight which passed the liquid crystal layer LQ penetrates the second polarization plate PL2 (white display). However, in the position in which the liquid crystal molecule overlaps with the pixel electrode PE and the common electrode CE, since the liquid crystal molecule is maintained in the initial alignment state, the state becomes a black display like the time of OFF.

According to this embodiment, the array substrate AR is equipped with the sub-common electrodes (first sub-common electrode CB1 and second sub-common electrode CB2) of two layers holding the same potential (for example, common potential) on the liquid crystal layer LQ side of each gate line G. The first sub-common electrode CB1 located in a lower layer faces the gate line G. For this reason, it becomes possible to shield undesirable leaked electric field which goes to the liquid crystal layer LQ from the gate line G. Therefore, the influence by the undesirable electric field in the domain close to the gate line G is eased in the penetration domains, and it becomes possible to control degradation of display grace.

Moreover, since the second sub-common electrodes CB2 located in the upper layer of two layers is arranged in dispersion in the active area ACT, and electrically connected with the adjoining two second main common electrodes CA2, it becomes possible to improve redundancy. That is, even if disconnection occurs in a portion of the second main common electrode CA2 it becomes possible to supply common potential to any second main common electrodes CA2 through the second sub-common electrode CB2. Therefore, even if a pixel pitch becomes very small and the width of the second main common electrode CA2 becomes thin with the demand for a high definition display, it becomes possible to control generating of a display defect due to disconnection all over the active area.

In addition, in a region in which the second sub-common electrode CB2 is not arranged, it becomes possible to extend the both ends of the main pixel electrode PA to the position which overlaps with the gate line G. Thereby, it becomes possible to form uniform electric field between the main pixel electrode PA and the second main common electrode CA2 (or the third main common electrode CA3) along the first direction X from the upper end (circumferences of the gate line G1) to the lower end (circumferences of the gate line G2), not only in the central portion of the pixel PX. That is, in the circumferences of the gate line G, since it becomes possible to suppress the formation of the electric field in an oblique direction with respect to the first direction X, and to uniformly control the alignment of the liquid crystal molecule LM, it also becomes possible to expand the area which contributes to the display.

Moreover, according to this embodiment, the array substrate AR includes two layers of main common electrodes (the first main common electrode CA1 and the second main common electrode CA2) facing the liquid crystal layer LQ along each source line S, to which the same potential, i.e., the common potential is applied. The first main common electrode CA1 in the lower layer is arranged inside of the pixel rather than above the source line S. The second main common electrode CA2 in the upper layer is located right above the source line S2. Since the first main common electrode CA1 and the second main common electrode CA2 are set to the same potential, an equipotential surface is formed therebetween. The equipotential surface shields undesirable leaked electric field which directs to the liquid crystal layer LQ from the source line S arranged in the lower layer. Thus, the influence by the leaked electric field from the source line S can be eased in the region close to the source line S, and it also becomes possible to control degradation of the display grace.

Moreover, according to this embodiment, it becomes possible to control formation of the undesirable capacitance between the source line S and the first main common electrode CA1, and also to reduce the load of the source line S. Thereby, it becomes possible to suppress the defect of the display grace and increase of the power consumption of the liquid crystal display device due to the load of the source line S. Moreover, since the second main common electrode CA2 facing the source line S is located more apart from the source line S than the first main common electrode CA1 is located, it becomes possible to reduce the influence to the display by the capacitance formed between the source line S and the second main common electrode CA2.

Moreover, the third common electrode CE3 is formed in the shape of a lattice which faces the second common electrode CE2, and set to the same potential as the second common electrode CE2. Accordingly, an equipotential surface of common potential is formed between the second common electrode CE2 and the third common electrode CE3. Even if assembly shift arises, the equipotential surface maintains the liquid crystal molecule LM in the initial alignment state at the time of ON and OFF. Thereby, it becomes possible to control generation of mixed colors.

Figure 6:
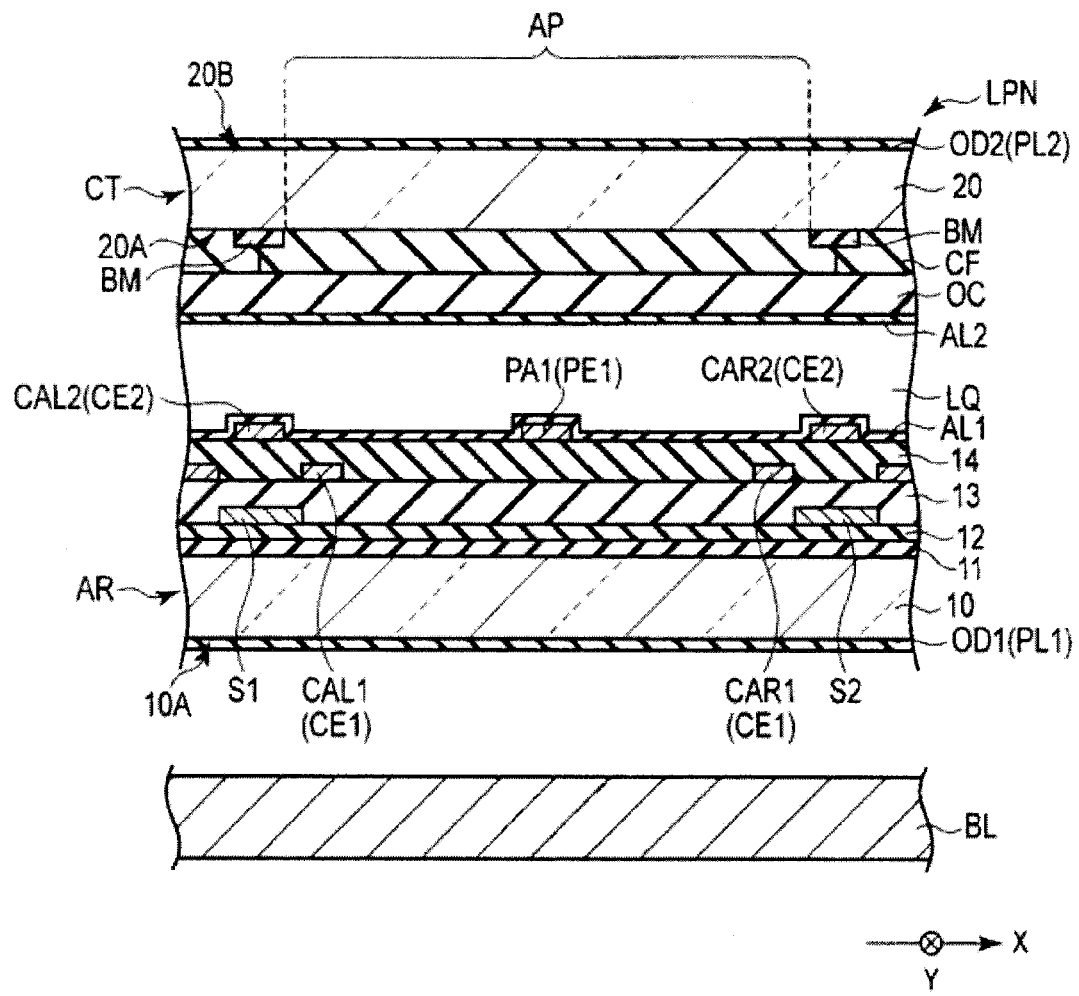
FIG. 6 is a cross-sectional view schematically showing the structure of the liquid crystal panel LPN taken along a line in a first direction X according to a second embodiment.
Figure 7:
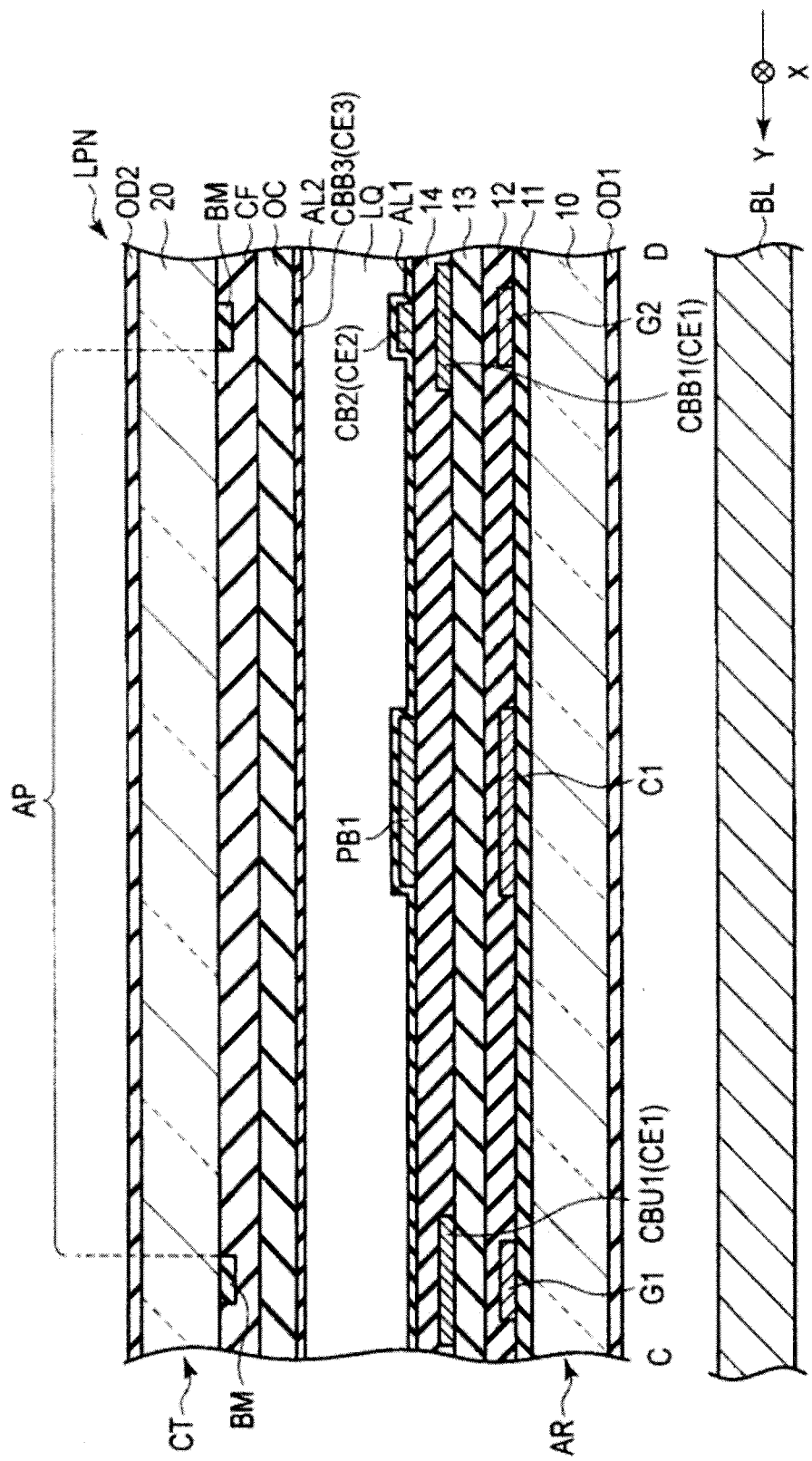
FIG. 7 is a cross-sectional view schematically showing the structure of the liquid crystal panel LPN taken along a line in a second direction Y according to the second embodiment.

FIG. 6 is a cross-sectional view schematically showing the structure of the liquid crystal panel LPN taken along a line in a first direction X according to a second embodiment. FIG. 7 is a cross-sectional view schematically showing the structure of the liquid crystal panel LPN taken along a line in a second direction Y according to the second embodiment.

The structure shown herein is different from the structure shown in FIG. 4 in that the third common electrode of the counter substrate CT is omitted. In the counter substrate CT, the whole surface of the overcoat layer OC on the side facing the array substrate AR is covered with the second alignment film AL2. In this structure, electric field required for controlling the alignment of the liquid crystal molecule between the pixel electrode PE1 and the second common electrode CE2 is formed at the time of ON.

The second sub-common electrode CB2 is arranged in dispersion. In the illustrated example, the second sub-common electrode CB2 is not arranged above the gate line G1, but arranged only above the gate line G2, and faces the first sub-common electrode CBB1. Thereby, the same effect as the first embodiment is acquired in this second embodiment.

As explained above, according to the embodiments, the liquid crystal display device being capable of improving display grace can be supplied.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A liquid crystal display device, comprising:
a first substrate including;
   a gate line extending in a first direction,
   first, second and third source lines extending in a second direction crossing the first direction,
   a first interlayer insulating film arranged on the gate line and the first, second and third source lines,
   a first common electrode including a first sub-common electrode extending in the first direction on the first interlayer insulating film and facing the gate line,
   a second interlayer insulating film covering the first common electrode,
   a first pixel electrode provided in a first pixel and including a first main pixel electrode extending in the second direction on the second interlayer insulating film between the first source line and the second source line, and
   a second pixel electrode provided in a second pixel arranged adjoining the first pixel in the first direction and including a second main pixel electrode extend- ing in the second direction on the second interlayer insulating film between the second source line and the third source line, and a second common electrode including a second sub-common electrode and a second main common electrode set to the same potential as the first common electrode, wherein the second sub-common electrode extends on the second interlayer insulating film between the first source line and the second source line in the first direction so as to face the first sub-common electrode, and is cut out between the second source line and the third source line, and the second main common electrode extends in the second direction facing each of the first, second and third source lines, a second substrate arranged facing the first substrate; and a liquid crystal layer held between the first substrate and the second substrate.

2. The liquid crystal display device according to claim 1, wherein an end of the first main pixel electrode is more apart from the gate line than an end of the second main pixel electrode is apart from the gate line.

3. The liquid crystal display device according to claim 1, wherein the length of the first main pixel electrode along the second direction is shorter the length of the second pixel electrode along the second direction.

4. The liquid crystal display device according to claim 1, wherein the second substrate includes a third common electrode equipped with a third main common electrode extending in the second direction and facing the second main common electrode, and the third common electrode is set to the same potential as the potential of the second common electrode.

5. The liquid crystal display device according to claim 4, wherein the third common electrode includes a third sub-common electrode extending in the first direction.

6. The liquid crystal display device according to claim 1, wherein a storage capacitance line is arranged substantially in a center of the first and second pixels extending in the first direction.

7. The liquid crystal display device according to claim 6, wherein the first pixel electrode includes a first sub-pixel electrode arranged substantially in a center of the first pixel extending in the first direction, the second pixel electrode includes a second sub-pixel electrode arranged substantially in a center of the second pixel extending in the first direction, and the first and second sub-pixel electrodes are arranged overlapping with the storage capacitance line, and cross the first and second main pixel electrodes in an intermediate portion thereof in the second direction, respectively.

8. The liquid crystal display device according to claim 1, wherein an end of the second main pixel electrode extends to an overlapping portion with the gate line.

9. A liquid crystal display device comprising;

a first substrate including;

first, second and third main common electrodes arranged in a first direction and extending in a second direction crossing the first direction, a sub-common electrode extending in the first direction and electrically coupling the first main common electrode with the second main common electrode, first and second pixel electrodes located between the first main common electrode and the second main common electrode, and adjoining in the second direction sandwiching the sub-common electrode, third and fourth pixel electrodes located between the second main common electrode and the third main common electrode, and adjoining in the second direction, and a first alignment film covering the first, second and third main common electrodes, the sub-common electrode, and the first, second, third and fourth pixel electrodes, wherein the respective lengths of the first and second pixel electrodes are shorter than the lengths of the third and fourth pixel electrodes in the second direction, and a second substrate equipped with a second alignment film facing the first alignment film; and a liquid crystal layer held between the first substrate and the second substrate.

10. The liquid crystal display device according to claim 9, wherein the second substrate includes a fourth main common electrode extending in the second direction and facing the first, second and third main common electrodes, respectively, and the fourth main common electrode is set to the same potential as the potential of the first, second and third main common electrodes.

11. A liquid crystal display device comprising;

a first substrate including;

first, second and third main common electrodes arranged in a first direction and extending in a second direction crossing the first direction, a first sub-common electrode extending in the first direction and electrically coupling the first main common electrode with the second main common electrode, first and second pixel electrodes located between the first main common electrode and the second main common electrode, and adjoining in the second direction sandwiching the sub-common electrode, third and fourth pixel electrodes located between the second main common electrode and the third main common electrode, and adjoining in the second direction, and a first alignment film covering the first, second and third main common electrodes, the sub-common electrode, and the first, second, third and fourth pixel electrodes, wherein a second sub-common electrode is not provided between the second main common electrode and the third main common electrode on a straight line extending along the first sub-common electrode in the first direction, and the distance between adjoining ends of the first pixel electrode and second pixel electrode is longer than the distance between adjoining ends of the third pixel electrode and the fourth pixel electrode, a second substrate equipped with a second alignment film facing the first alignment film; and a liquid crystal layer held between the first substrate and the second substrate.

12. The liquid crystal display device according to claim 11, wherein the second substrate includes a fourth main common electrode extending in the second direction and facing the first, second and third main common electrodes, respectively, and the fourth main common electrode is set to the same potential as the potential of the first, second and third main common electrodes.

\* \* \* \* \*